United States Patent [19]

Kobayashi

[11] Patent Number: 5,048,375
[45] Date of Patent: Sep. 17, 1991

[54] METHOD FOR CONSTRUCTING A ROTATING CUTTING TOOL

[76] Inventor: Yoshinobu Kobayashi, 2047, Shimotsuruma, Yamato-shi, Kanagawa-ken, 242, Japan

[21] Appl. No.: 598,814

[22] Filed: Oct. 16, 1990

Related U.S. Application Data

[63] Continuation of Ser. No. 404,496, Sep. 8, 1989, abandoned.

[30] Foreign Application Priority Data

Sep. 22, 1988 [JP] Japan ............................ 63-124412[U]

[51] Int. Cl.$^5$ .......................... B21K 5/02; B23B 51/02
[52] U.S. Cl. .................................. 76/108.6; 279/103; 408/144; 408/226; 408/239 R
[58] Field of Search ..................... 279/102, 103, 104; 408/1 R, 144, 226, 238, 239 A, 239 R; 76/108.6

[56] References Cited

U.S. PATENT DOCUMENTS

| | | | |
|---|---|---|---|
| 1,285,589 | 11/1918 | Barnes | 76/108.6 |
| 1,409,753 | 3/1922 | Moore | 76/108.6 |
| 2,369,321 | 2/1945 | Stalker | 279/102 |
| 3,678,632 | 7/1972 | Eversole et al. | 408/144 |
| 3,751,176 | 8/1973 | Von Hollen | 408/226 |
| 3,790,297 | 2/1974 | Maursey | 408/226 |

FOREIGN PATENT DOCUMENTS

| | | | |
|---|---|---|---|
| 2811977 | 9/1979 | Fed. Rep. of Germany | 408/226 |
| 3232686 | 3/1984 | Fed. Rep. of Germany | 408/144 |
| 8101761 | 11/1982 | Netherlands | 408/239 A |
| 53632 | 10/1910 | Switzerland | 408/226 |
| 645773 | 2/1979 | U.S.S.R. | 279/102 |
| 5471 | 2/1913 | United Kingdom | 408/226 |

OTHER PUBLICATIONS

Popular Mechanics Shop Notes, 1942, p. 202.

Primary Examiner—Daniel W. Howell
Attorney, Agent, or Firm—Cushman, Darby & Cushman

[57] ABSTRACT

Disclosed is a very small sized rotating and cutting tool comprising a rotating and cutting part such as drill bit and a shank which is a separate solid body having a through aperture permitting insertion of the rotating and cutting part into the through aperture and removal of the rotating and cutting part from the through aperture when it has been worn or broken. With this arrangement the worn or broken rotating and cutting part can be easily removed from the shank simply by pushing the rotating and cutting part out of the through aperture of the shank, and the shank can be reused. Also, advantageously the lathing of a relatively large cylinder into a "large-and-small cylindrical object" as is carried out in making a conventional miniature drill, is not required. For these reasons miniature rotating-and-cutting tools can be manufactured and marketed at reduced price.

3 Claims, 4 Drawing Sheets

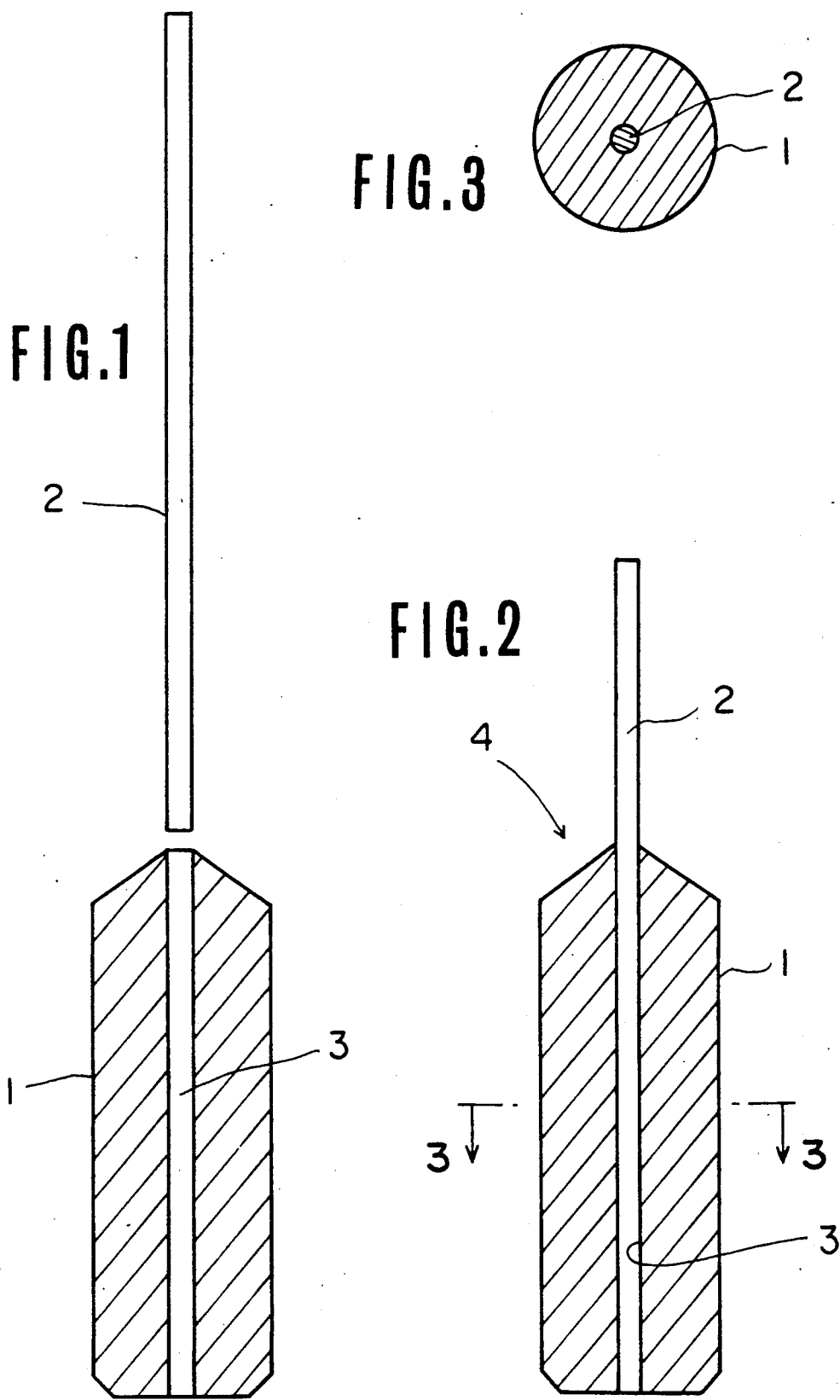

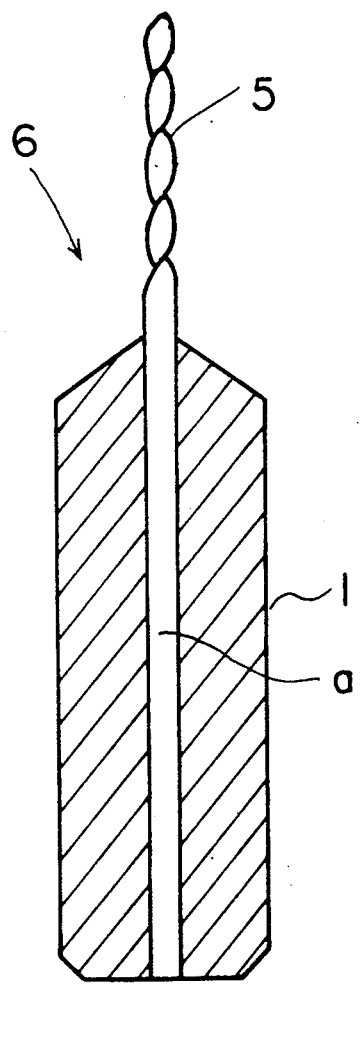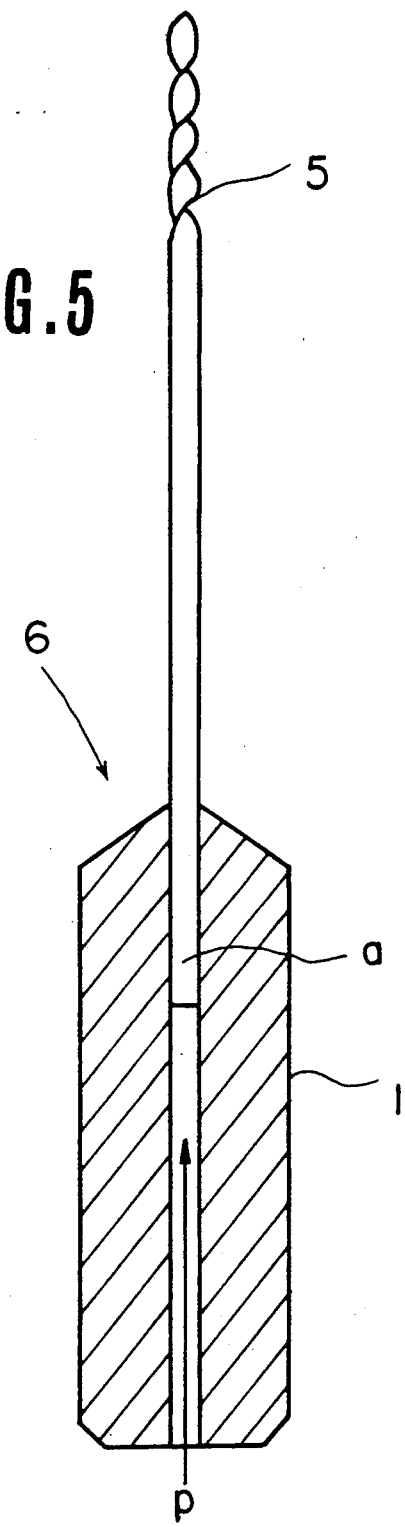

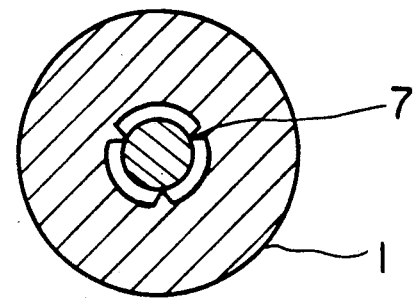
FIG.10
FIG.8
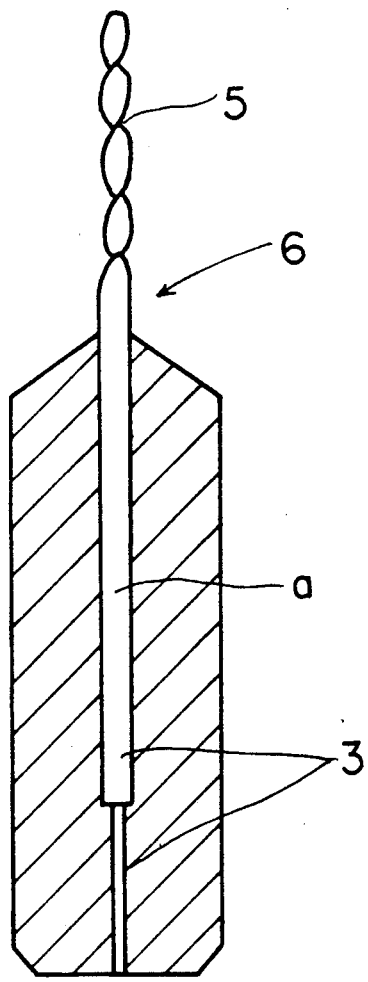
FIG.9
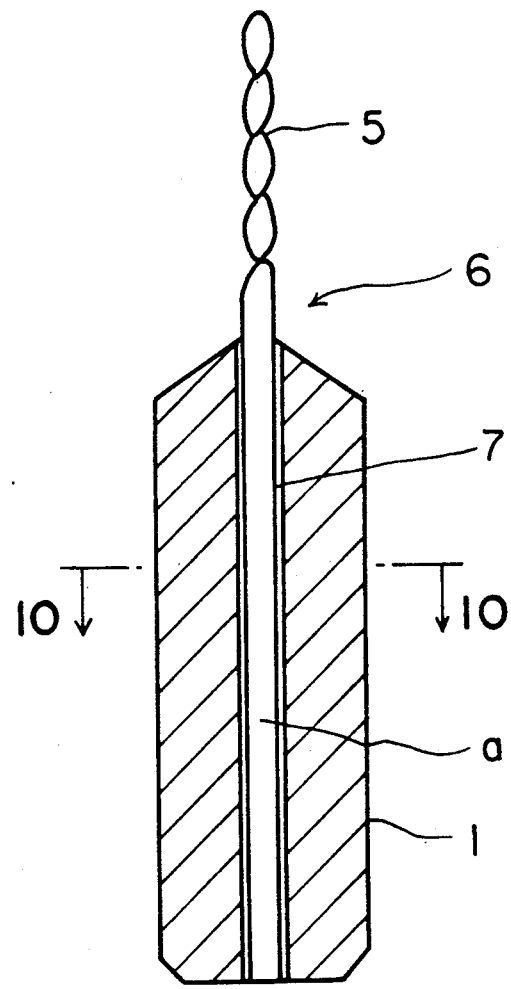

METHOD FOR CONSTRUCTING A ROTATING CUTTING TOOL

This is a continuation of application Ser. No. 07/404,496, filed on Sept. 8, 1989, which was abandoned upon the filing hereof.

BACKGROUND OF THE INVENTION

1. Field of the Invention

The present invention relates to a shank of a very small sized rotating and cutting tool such as a drill appropriate for use in making small precise holes in printed boards, buttons or other small articles.

2. Description of the Prior Art

A variety of very small sized rotating and cutting tools have been widely used. Such a very small sized rotating and cutting tool is represented by a miniature drill, and it comprises a rotating and cutting part ranging from 0.3 mm to 1.5 mm in diameter and a shank integrally connected to the rotating and cutting part and having a diameter of 3.175 mm. This is hereinafter called a "small-and-large cylindrical object".

In making such a "small-and-large cylindrical object" a rod of a super hard alloy, such as WC-Co is prepared, and the rod is centerless-supported, and is subjected to surface grinding and subsequent end-cutting. Thereafter, the rod is machined into a "small-and-large cylindrical object". Specifically, a part of the rod which is to be a rotating and cutting part such as a drill bit, is subjected to coarse machining to reduce the diameter of the part to 0.3 to 1.5 mm, and then, the tip of the part is subjected to fine machining to be reduced into a tapered shape.

This machining requires strict precision as is attained for example, by an NC centerless cutting machine. The exact center alignment of the bit and shank is required and the bit size is very small (0.3 to 1.5 mm). The part of the rod to be reduced into a bit is fragile, and can be easily broken while being machined. Such precision machining is a factor for increasing the manufacturing cost.

After finishing such precision machining, the semimanufactured object is subjected to bit grooving, bit tip machining, undercutting and other necessary machining. Finally, a miniature drill results.

According to another conventional manufacturing process, a relatively large cylinder for a shank and a relatively small cylinder for a bit are prepared separately, and a hole for attaching the bit to the shank is made on one end of the relatively large cylinder. The relatively small cylinder is inserted into the hole of the relatively large cylinder, and is soldered to the relatively large cylinder. Thus, a miniature drill results.

This second manufacturing method is advantageous over the first manufacturing method because no precision machining using an NC centerless cutting machine is required and because machining is much easier than that in the first manufacturing method.

Miniature drills have a drill bit of very small diameter, resulting in a high likelihood that the drill bit will be broken while making holes. Also, the drill bit is likely to be worn. As for the miniature drill which is manufactured according to the first manufacturing method and is composed of a bit-and-shank integration; when its bit is worn or broken, the tool must be changed as a whole for a new one. This means that the shank of the tool is thrown away in spite of having no defect. Stated otherwise, the shank cannot be reused. This is economically disadvantageous, when the manufacturing cost of the bit-and-shank integration is considered.

As for the miniature drill which is manufactured according to the second manufacturing method, and is composed of an integral connection of separate bit and shank portions: when its bit is worn or broken, the tool must be changed as a whole for a new one, as is the case with the first miniature drill. It is most likely that the drill bit will be broken in the vicinity of the end of the shank, leaving the broken part in the hole of the shank. Therefore, the shank cannot be reused because it is actually impossible to remove the broken part from the hole of the shank.

SUMMARY OF THE INVENTION

One object of the present invention is to provide an improved miniature rotating and cutting tool which can be easily manufactured and which permits reuse of the shank by the insertion of a new drill bit if the old drill bit is worn or even if the drill bit is broken, leaving the broken part in the hole of the shank.

To attain this object, a very small sized rotating and cutting tool comprises a rotating and cutting part such as a drill bit which is relatively small in diameter and a shank which is relatively large in diameter integrally connected to said rotating and cutting part. The improvement according to the present invention is that said shank is a separate solid body having a through aperture extending from one end to the other end of said solid body and which permits insertion of said rotating and cutting part into said through aperture and removal of said rotating and cutting part from said through aperture when said rotating and cutting part has worn or has been broken.

This arrangement just described permits removal of the worn or broken rotating and cutting part from the shank part of the too simply by inserting an appropriate rod into the through aperture of the shank from the rear end thereof and pushing the worn or broken rotating and cutting part out of the shank with the rod, thus permitting reuse of the shank by inserting a new rotating and cutting part into the shank. If the worn or broken rotating and cutting part is soldered to the shank, the heating of shank is necessary to melt and soften the soldering, thereby making it easy to pull the worn drill bit or remaining broken part from the shank. If the worn or broken rotating and cutting part is fixed to the shank by an interference fit between the shank and the drill bit, heating of the shank is also necessary to cause thermal expansion of the shank, thereby making it easy to remove the worn drill bit or remaining broken part from the shank.

The structure of the very small sized rotating and cutting tool according to the present invention advantageously obviates the integral machining of a rod material into a "small-and-large cylindrical object", for example, by high-precision lathing. Such separate tool structure of a rotating and cutting part and a shank part is advantageous for manufacturing the miniature tool.

Other objects and advantages of the present invention will be understood from the following description of a very small sized rotating and cutting tool according to preferred embodiments of the present invention, which are shown in the accompanying drawings:

FIGS. 1-5 show a very small sized rotating and cutting tool according to a first embodiment of the present invention, and specifically, FIG. 1 shows a rod material and a shank in longitudinal section prior to insertion;

FIG. 2 shows the manner in which the rod is inserted into and fixed to the shank;

FIG. 3 is a cross section taken along the line 3—3 in FIG. 2;

FIG. 4 shows, partly in section, a resultant miniature drill; and

FIG. 5 shows the manner in which the worn drill bit is removed from the through aperture of the shank.

FIG. 6 shows the manner in which the drill bit is inserted midway to the rear end of the through aperture of the shank; and FIG. 7 is a cross section taken along the line 7—7 in FIG. 6.

FIG. 8 shows, in section, a very small sized rotating and cutting tool according to a third embodiment of the present invention.

FIGS. 9 and 10 show a very small sized rotating and cutting tool according to a fourth embodiment of the present invention and specifically;

FIG. 9 shows the manner in which the drill bit is inserted into the through aperture of the shank, and is fixed to the shank; and FIG. 10 is a cross section taken along the line 10—10 in FIG. 9.

Figure 7:
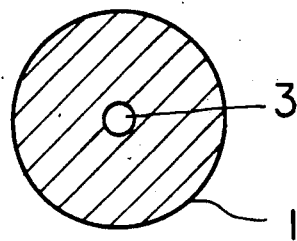
FIGS. 6 and 7 show a very small sized rotating and cutting tool according to a second embodiment of the present invention and specifically.

Referring to FIGS. 1 to 5, a rod material is indicated at 2, and a shank is indicated at 1. As shown, the shank 1 has a through aperture 3 made therein and extending one end to the other end thereof. The through aperture 3 of the shank 1 has a diameter adequate to permit insertion of the rod material 2. A variety of materials may be used to make the rod and the shank. Usually, the rod 2 may be made from a super hard alloy such as WC-Co whereas the shank 1 may be made from a similar super high alloy or stainless steel or Hice. At the stage in which a through aperture 3 is made in the shank material, it is subjected to side and end shaping, tapering and other necessary machining.

FIG. 1 shows the rod 2 and the shank 1 after these machinings are finished. The root "a" of the rod 2 is inserted into the through aperture 3 of the shank 1. Then, a soldering material is pushed into the annular gap between the root "a" of the rod 2 and the shank 1, and the shank 1 is heated to permit the soldering of the root "a" of the rod 2 to the shank 1, as shown in FIGS. 2 and 3. Alternatively, the rod 2 can be attached to the shank 1 by an interference fit. The interference fit can be provided by heating the shank 1 before insertion of the rod 2 or can be provided by forcing the rod 2 into the through-aperture 3. The shank having the rod 2 integrally connected thereto, is indicated at 4 as a whole. This semifinished product will be subjected to bit grooving, sharpening, undercutting and other necessary machinings as carried out in manufacturing a conventional miniature drill. Thus, a miniature drill having a drill bit 5 results as shown in FIG. 4. The required machinings are easy, compared with those in manufacturing conventional miniature drills because the high-precision machining of reducing a selected part of a relatively large cylinder into a relatively small cylinder is not required. In place of such high-precision machining, a rod is inserted into and soldered to a shank, which is already machined and finished into a desired shape and size.

When the drill bit of the tool is worn or broken during its use, the root "a" of the drill bit 5 will be removed in the shank 1, as seen from FIG. 5. FIG. 5 shows the removal of the worn drill bit from the shank 1. If the drill bit is broken, the broken root "a" of the tool will be left in the through aperture of the shank 1. In either case, a rod (not shown) is inserted into the through aperture of the shank 1 from the rear end of the shank to push the remaining part of the drill bit 5 in the direction as indicated by arrow "p" until it has been pushed out of the through aperture of the shank. Removal of the worn or broken drill bit from the shank is permitted after the shank is heated to melt the soldering or thermally expand the shank, thereby unfastening the drill bit from the shank.

The shank 1 can be reused according to the sequential proceedings as shown in FIGS. 1 to 4. This reuse of shanks provides a great economical advantage, particularly in mass production of miniature drills.

Figure 6:
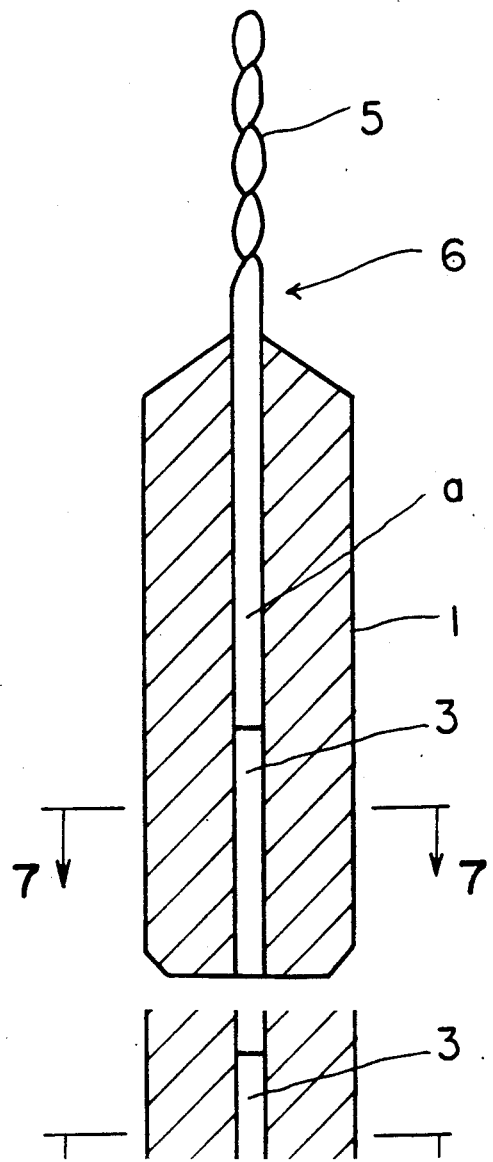

Referring to FIGS. 6 and 7, a miniature drill according to the second embodiment is shown as having a drill bit 5 inserted half-way to the rear end of the through aperture 3 of the shank 1. The drill bit 5 is fixed to the shank 1 by soldering or by an interference fit. The shank 1 can be reused when the drill bit 5 is worn or broken, as is the case with the first embodiment.

Referring to FIG. 8, a miniature drill according to the third embodiment is shown as using a shank having a through aperture of relatively large diameter and relatively small diameter. In use, a drill bit 5 is inserted into the large aperture section of the through aperture until the end of the drill bit has reached the large-to small aperture transition of the through aperture 3. The drill bit 5 is fixed to the shank 1 by soldering or by an interference fit. When the drill bit 5 is removed from the shank 1, a rod is inserted in the small aperture section of the shank 1 to push the worn or broken drill bit 5 out of the through aperture of the shank. Thus, the shank 1 can be reused.

Referring to FIGS. 9 and 10, a miniature drill according to the fourth embodiment is shown as using a shank having a through aperture with a plurality of discrete ridges 7 arranged in parallel longitudinal directions and integrally connected to the inner surface of the through aperture The root "a" of the drill bit is inserted into the through aperture and is fixed to the ridges 7. In this particular embodiment, the drill bit 5 is fixed to the shank 1 at three or more discrete points, thereby facilitating the removal of the worn or broken drill bit 5 from the shank 1.

As may be understood from the above, the miniature rotating and cutting tool structure which permits the integration of a separate rotating with a cutting part and shank part, provides the following advantages:

1) The worn or broken rotating and cutting part can be easily removed from the shank, and the shank can be reused.

2) Lathing of a relatively large cylinder into a "large-and-small cylindrical object" is not required. Manufacturing of a miniature rotating and cutting tool according to this invention requires no precision maching or lathing.

3) For these reasons, miniature rotating-and-cutting tools can be marketed at a reduced price.

What is claimed is:

1. A method for constructing a rotating cutting tool comprising the steps of:

providing a rotating cutting part;

providing a solid monolithic shank which is larger in diameter than the rotating cutting part;

providing a through-aperture in the shank extending from a first end of the shank to a second end of the shank;

heating the shank to expand the shank;

inserting the rotating cutting part into the first end of the through-aperture of the heated shank;

cooling the shank to contract the shank around the rotating cutting part; wherein the rotating cutting part can be removed from the shank and replaced when the rotating cutting part has worn and when the rotating cutting part has broken by reheating the shank to expand the shank, and pushing the rotating cutting part out of the shank through-aperture with a rod inserted in the second end of the through-aperture.

2. The method of claim 1, and further comprising the step of soldering the rotating cutting part to the shank while the shank is heated, wherein the solder is remelted when the shank is reheated so that the rotating cutting part can be pushed out of the shank through-aperture.

3. The method of claim 1, and further comprising the steps of providing a step in the through-aperture and inserting the rotating cutting part into the through-aperture until the rotating cutting part contacts the step.

* * * * *